US 6,618,853 B1

(12) United States Patent
Ohyama et al.

(10) Patent No.: US 6,618,853 B1
(45) Date of Patent: Sep. 9, 2003

(54) PROGRAM PRODUCTION SYSTEM FOR SEMICONDUCTOR TESTER

(75) Inventors: Chiaki Ohyama, Tokyo (JP); Junichi Hasebe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/415,041

(22) Filed: Oct. 7, 1999

(30) Foreign Application Priority Data

Oct. 10, 1998 (JP) .......................................... 10-303293

(51) Int. Cl.[7] ................................................ G06F 9/45
(52) U.S. Cl. ...................... 717/109; 717/113; 717/125; 717/129; 700/121
(58) Field of Search ................................ 717/109, 113, 717/125, 129; 700/121

(56) References Cited

U.S. PATENT DOCUMENTS

| | | | | | |
|---|---|---|---|---|---|
| 4,606,025 | A | * | 8/1986 | Peters et al. ................. | 714/718 |
| 4,903,199 | A | * | 2/1990 | Keenan et al. ................ | 714/25 |
| 5,063,383 | A | * | 11/1991 | Bobba ........................ | 341/120 |
| 5,202,889 | A | * | 4/1993 | Aharon et al. ............... | 714/739 |
| 5,400,263 | A | * | 3/1995 | Rohrbaugh et al. .......... | 700/213 |
| 5,414,836 | A | * | 5/1995 | Baer et al. ..................... | 714/38 |
| 5,434,805 | A | * | 7/1995 | Iwasaki ..................... | 324/73.1 |
| 5,473,618 | A | * | 12/1995 | Takeshita et al. ........... | 714/733 |
| 5,617,427 | A | * | 4/1997 | Ohta et al. .................. | 714/729 |
| 5,850,548 | A | * | 12/1998 | Williams .................... | 717/107 |
| 5,861,882 | A | * | 1/1999 | Sprenger et al. ............. | 345/700 |
| 5,875,198 | A | * | 2/1999 | Satoh ......................... | 714/740 |
| 5,910,895 | A | * | 6/1999 | Proskauer et al. .......... | 700/121 |
| 5,935,264 | A | * | 8/1999 | Nevill et al. ................. | 714/724 |
| 6,011,830 | A | * | 1/2000 | Sasin et al. .............. | 379/10.03 |
| 6,029,262 | A | * | 2/2000 | Medd et al. ................. | 714/724 |
| 6,038,378 | A | * | 3/2000 | Kita et al. ..................... | 714/38 |
| 6,038,395 | A | * | 3/2000 | Chow et al. ................ | 717/105 |
| 6,115,835 | A | * | 9/2000 | Nevill et al. ................. | 714/724 |
| 6,128,759 | A | * | 10/2000 | Hansen ........................ | 700/121 |
| 6,195,774 | B1 | * | 2/2001 | Jacobson ..................... | 714/727 |
| 6,202,187 | B1 | * | 3/2001 | Akiyama ..................... | 714/739 |

FOREIGN PATENT DOCUMENTS

| EP | 0-869433 A2 | * 10/1998 | ........... G06F/11/00 |
|---|---|---|---|
| JP | 6-281692 | * 10/1994 | ........... G01R/31/28 |

OTHER PUBLICATIONS

O'Toole et al., Next Generation Graphical Development Environment for Test, IEEE, Aug. 24, 1998, pp. 145–148.*
Hils, Data Vis: A Programming Language for Scientific Visualization, ACM, 1991, pp. 439–448.*
Smith, Building Interfaces Interactively, ACM, 1988, pp. 144–151.*
Whitley et al., Visual Programming: The Outlook from Academia and Industry, ACM, Oct. 1997, pp. 180–208.*
Mok et al., An RTL Semantics for LabView, IEEE, Mar. 21, 1998, pp. 61–71.*
Gray et al., LabView, aA Tool for Modeling Complex Signal Processing Architectures, Mar. 20, 1998, IEEE, pp. 3/1–3/6.*
Trischler, An Integrated Design for Testability . . . , 1984, IEEE, pp. 209–215.*
Hand, Debugging Embedded Systems Implemented in C, 1991, ACM, pp. 17–22.*

* cited by examiner

Primary Examiner—John Chavis
(74) Attorney, Agent, or Firm—Dellett and Walters

(57) ABSTRACT

There is disclosed a program production system for a semiconductor tester which performs production of programs while various kinds of information are viewed on screens. A user sets an execution sequence for commands on a target by specifying any from among the program cells included on a sequence setting screen and sets the functions used in semiconductor testing corresponding to those commands and the parameters accompanying the functions by using a function setting screen.

5 Claims, 13 Drawing Sheets

FIG. 11

DefineVariableWindow kind of variable : ⦿user ○GLOBAL ○FK

[variable table]

| name | size | type | comment |
|---|---|---|---|
| fLoSgS11 | 1 | double | |
| faildata | 1 | int | fail data area |
| freq..change | 1 | int | ModLocal Att Value |
| harm | 4 | double | |
| i | 1 | double | |
| index | 1 | int | VFG D/A Value |
| k | 1 | double | | change  name : faildata   add   size : 1   delete ◀▶ comment : fail data area   type : int   search

OK   Cancel

SeqEditor : sample2.seq*

File Edit Create Function Variable BreakPoint Option

○ Debug  ● Edit    Start   Reset   Cont    Next    Step

TEST 4300 [                                                                    ]

| | |
|---|---|
| 8 | wait vfd1 to TimeDatMod |
| 9 | read vfd1 to TimeDatMod |
| 10 | stop vfg1 |
| 11 | stop event |
| 12 | AbsTimeMod=pow(TimeDatMod, 2.000000) |
| 13 ★ | PowMod=sum(AbsTimeMod) |
| 14 | PinMod=PowMod/32768 |
| 15 | PinMod=PowMod/0.050000 |
| 16 | PowMod=log10(PowMod) |
| 17 | PowMod=PowMod*10 |
| 18 | PinMod=PowMod+deltaInMod |
| 19 | set rf meas=scalar, select=port2 |
| 20 | |
| 21 | read fail (4300) to fail data |
| 22 | |

PROGRAM PRODUCTION SYSTEM FOR SEMICONDUCTOR TESTER

BACKGROUND OF THE INVENTION

The present invention relates to a program production system for a semiconductor tester which produces device testing programs to be used on a semiconductor tester.

Semiconductor testers that perform prescribed operating tests on various semiconductor devices are known in the conventional art. For example, a semiconductor tester suited to each type of semiconductor device is used when there is a semiconductor memory, a logic IC, and a linear IC in a semiconductor device used as a device to be tested.

These various types of semiconductor testers perform prescribed functional tests or DC tests by executing prescribed device testing programs produced by a user. A control device by which the user enters various operating instructions and which displays test results is connected to the semiconductor tester.

In general, a computer is used as the control device. In addition to the functions for controlling the semiconductor tester, it has functions for the user to produce device testing programs and is used as a program production device. The procedure by which the user uses the control device to create device testing programs is the same as the procedure for creating general-use programs. First, a source program is written using an editor. Next, an object program is created from the source program using a compiler. After that, a debugging operation is performed on the object program using a debugger to ascertain the existence of error locations, if any. If error locations are detected, the compiler is used once again to create an object program after correcting the corresponding locations in the source program using the editor. These operations of source program correction, object program creation, and debugging are repeated until there are no more error locations.

However, in the conventional semiconductor tester as described above, it is necessary to have exclusive drivers that perform input/output control of hardware peculiar to the semiconductor tester and data reading/writing for registers that carry out various operating instructions. Operating systems (hereafter "OS") originally developed by manufacturers of semiconductor testers have heretofore been used as the OSs used by internal tester processors. For this reason, there has been a problem in that a great many work-hours are required in OS development. Furthermore, there is a problem in that the OS scale grows to a large size, since original OSs for semiconductor testers have generally been developed by partial change its kernels or adding new kernels by using a general-purpose OS.

Furthermore, since programs unique to the semiconductor tester are used as the device testing programs executed on the exclusive OS, there is a problem in that labor is required in program production because the user producing the device testing programs must search for various commands and functions peculiar to the device testing programs by referencing manuals until realizing the desired functions.

Moreover, since what the user can produce directly is a source program for the device testing program, after detecting error locations in the object program through a debugging operation, it is necessary to correct the locations corresponding to those errors in the source program using an editor and then to convert the source program once again into an object program using the compiler. Thus there is a problem in that a great many work-hours are required for this series of debugging operations in cases in which there are many error locations.

The present invention was accomplished in consideration of these points; the object of the present invention is to provide a program production system for semiconductor testers that can reduce the labor required to develop an OS and testing programs and that can simplify debugging operations.

SUMMARY OF THE INVENTION

In one preferred embodiment, the program production system for a semiconductor tester according to the present invention makes it possible to set the execution sequence of commands contained in a program simply by setting the positions of program cells displayed on a sequence setting screen and to set the functions for semiconductor testing, which are the command contents, by selecting from among a plurality of functions displayed on function setting screens; when parameters are needed for those functions, the program production system for a semiconductor tester according to the present invention makes it possible to perform those settings on the function setting screens. Therefore, since it is possible to perform production of a program while viewing various kinds of information displayed on screens with virtually no need to refer to manuals or the like, it is possible to significantly reduce the labor required for program production.

It is preferable that a program be created as an object by creating individual groupings made up of 1) prescribed code corresponding to function types set by a function setting unit and 2) parameter values that have been converted into an execution format by a parameters calculating unit corresponding to those functions, and then assembling those groupings into an execution sequence set by a sequence setting unit. With program production of this kind, it is possible to obtain a program that can be executed directly without performing a compiling operation. The work-hours required for debugging operations can be significantly reduced as a result, since when performing program debugging a common program is used as the target for both editing and debugging.

It is further preferable that the functions corresponding to the program commands and the accompanying parameters respectively correspond to functions of the C programming language and their corresponding parameters. Producing programs using the C language will make it possible to produce programs that can be executed using almost any general-use operating system or processor, so that almost no work-hours will be required in their development in comparison to the development and use of operating systems peculiar to a semiconductor tester.

Furthermore, it is preferable that debugging execution unit be provided to perform debugging operations by execution of the program targeted for production. Since it will then be possible to execute the produced program in its original form, debugging work can be performed in parallel with program production and editing work, thus making it possible to raise the work efficiency of program production.

Furthermore, since it is possible to execute a produced program in its original form, break points for interruption of processing during debugging operations can be set in apart of the program cells used in program production. This will make it possible to perform more efficient program production that takes debugging into account. Since setting the break points at the time of program production or editing will eliminate the need to set the break points each time the occasion arises during debugging, it will thus be possible to perform debugging work more efficiently.

BRIEF DESCRIPTION OF THE DRAWINGS

FIG. 11 is a diagram showing a display example of a variable definition window that performs definition of variables;

FIG. 12 is a diagram showing a display example of a program on a main window.

DESCRIPTION OF THE PREFERRED EMBODIMENT

A semiconductor tester of a preferred embodiment of the present invention will be described below with reference to the figures.

[Semiconductor Tester]

Figure 1:
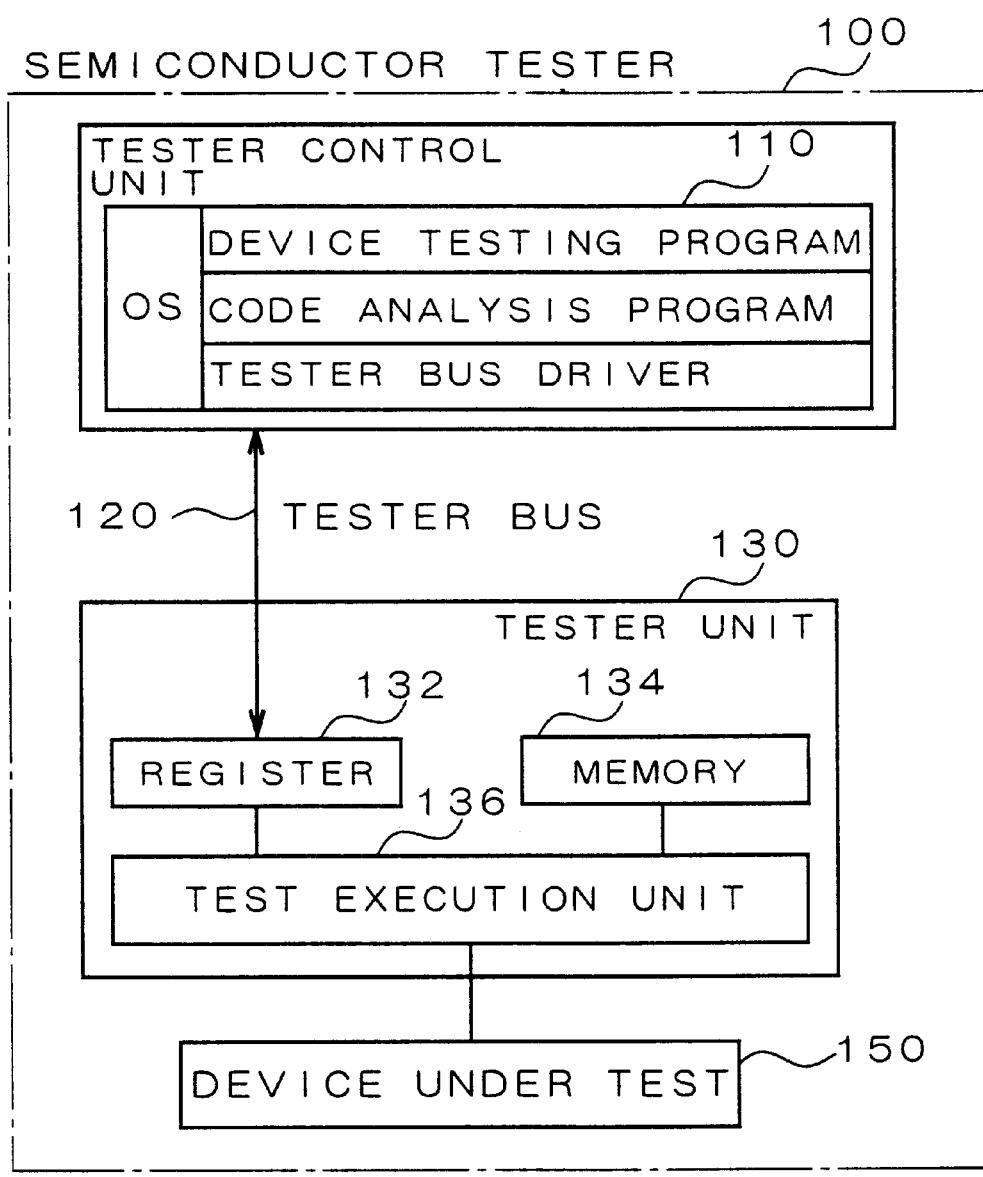
FIG. 1 is a diagram showing an overall configuration of a semiconductor tester that uses device testing programs produced in the preferred embodiment.

FIG. 1 is a diagram showing an overall configuration of a semiconductor tester that uses device testing programs produced in the preferred embodiment. A semiconductor tester 100 shown in FIG. 1 comprises a tester control unit 110, a tester bus 120, and a tester unit 130 for executing prescribed tests on a device under test 150.

The tester control unit 110 is for control of the operations of the tester unit 130, and contains a tester bus driver, code analysis programs, and device testing programs that operate on a prescribed OS. The OS used on the semiconductor tester 100 of the preferred embodiment is a general-use OS that has at least functions for executing programs produced using the C language. The device testing programs are programs in which a user states what kinds of tests to perform on the device under test 150 using the semiconductor tester 100 and are mainly produced by the user himself.

Figure 2:
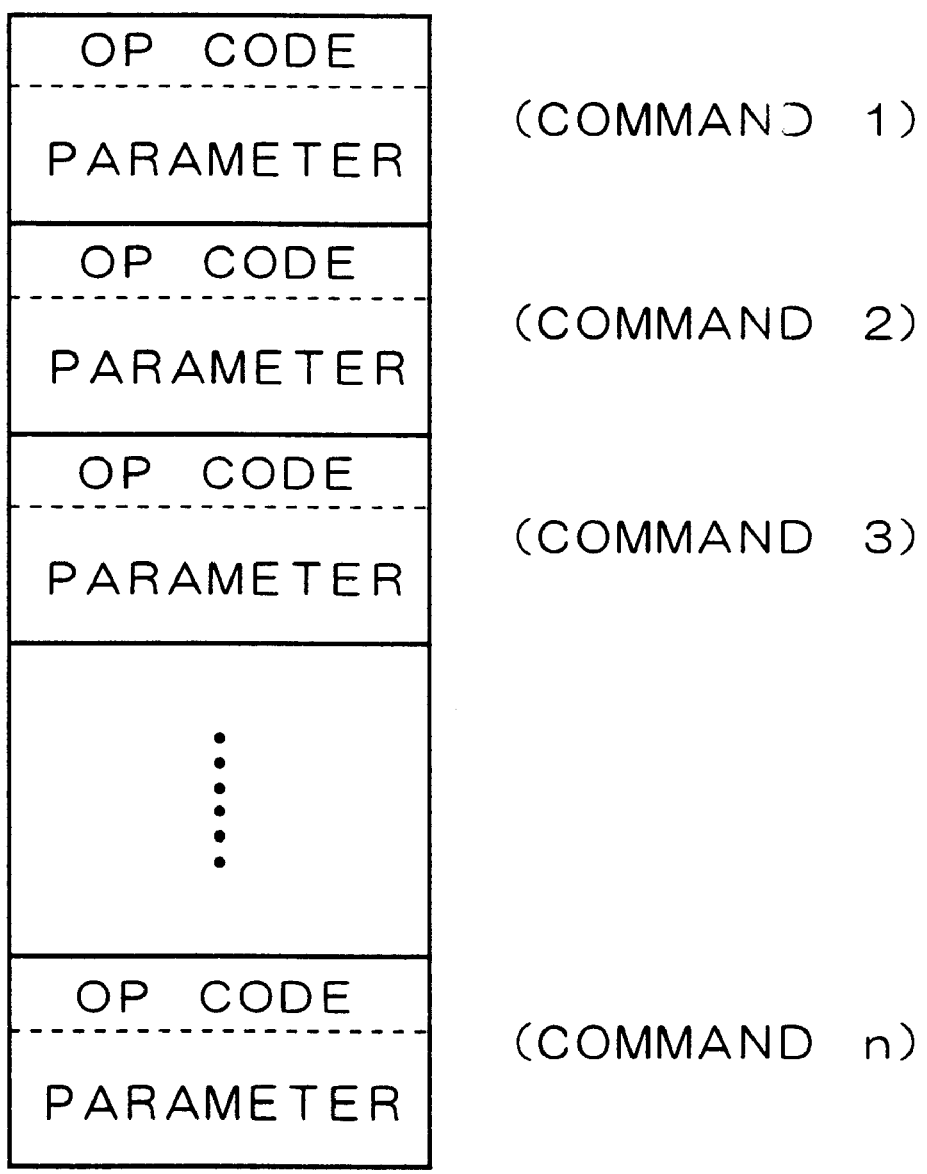
FIG. 2 is a diagram showing a simplified configuration of the device testing programs.

FIG. 2 is a diagram showing an outline configuration of a device testing program. A device testing program used in the semiconductor tester of the preferred embodiment is provided as an object comprising a plurality of commands 1, 2, . . . , n arranged in an execution sequence. The commands are combinations of prescribed operating codes (hereafter, "OP codes") corresponding to functions of the C language and specific values of various parameters possessed by those functions. These parameter values, in the case of producing an object program in the C language, are set as specific values of the parameters that have been generated to correspond to the functions. The OP codes are not the C language functions themselves; rather, prescribed codes are allocated corresponding on a one-to-one basis to functions of the C language.

At the time of device testing program execution, a code analysis program analyzes and converts the OP codes contained in the commands in a device testing program into executable code. As described above, the values of the parameters contained in the commands of the device testing program have a format that can be executed without any change, so the code analysis program merely processes conversion of the OP codes into an executable format, without performing processing to calculate parameter values or the like. In this way, since the code analysis processing performed for executing a device testing program is merely conversion into executable code by relatively simple processing, it is provided as an application program executed on the OS, rather than being provided on the OS level.

A tester bus driver is for sending and receiving various kinds of data through a tester bus 120. It performs control by sending setting data of various kinds required in function tests, DC tests or the like to the tester unit 130 and by receiving test results outputted from the tester unit 130.

The tester unit 130 shown in FIG. 1 is for performing various kinds of tests such as function tests, DC tests, RF tests (high-frequency tests) or the like on the device under test 150 under the control of the tester control unit 110 comprises a register 132, a memory 134, and a test execution unit 136.

The register 132 stores operating instructions and various types of data sent and received between it and the tester control unit 110. The data stored in the register 132 is sent to the test execution unit 136 either directly or through the memory 134. The test results data outputted by the test execution unit 136 are first stored in the register 132 or the memory 136 and then sent to the tester control unit 110 by way of the register 132. The test execution unit 136 contains various components (pattern generator, timing generator, and DC unit, for example) needed to execute function tests or the like on the device under test 150. The test execution unit 136 generates the various signals actually inputted into the device under test 150 and measures the data that appears at the output pins of the device under test 150.

In this way, a device testing program used on a semiconductor tester 100 of this embodiment possesses a structure that is fundamentally of the C language. When executed, the desired testing operations may be performed merely by analyzing the OP codes contained in the commands. Therefore, there is no need for an OS that possesses unique kernels corresponding to the device testing programs; a general-use OS that can execute the C language may be used. For this reason, virtually no work-hours are required to develop the OS, and the OS is prevented from becoming large in size since no kernels are added in development.

[Program Production Device]

Figure 3:
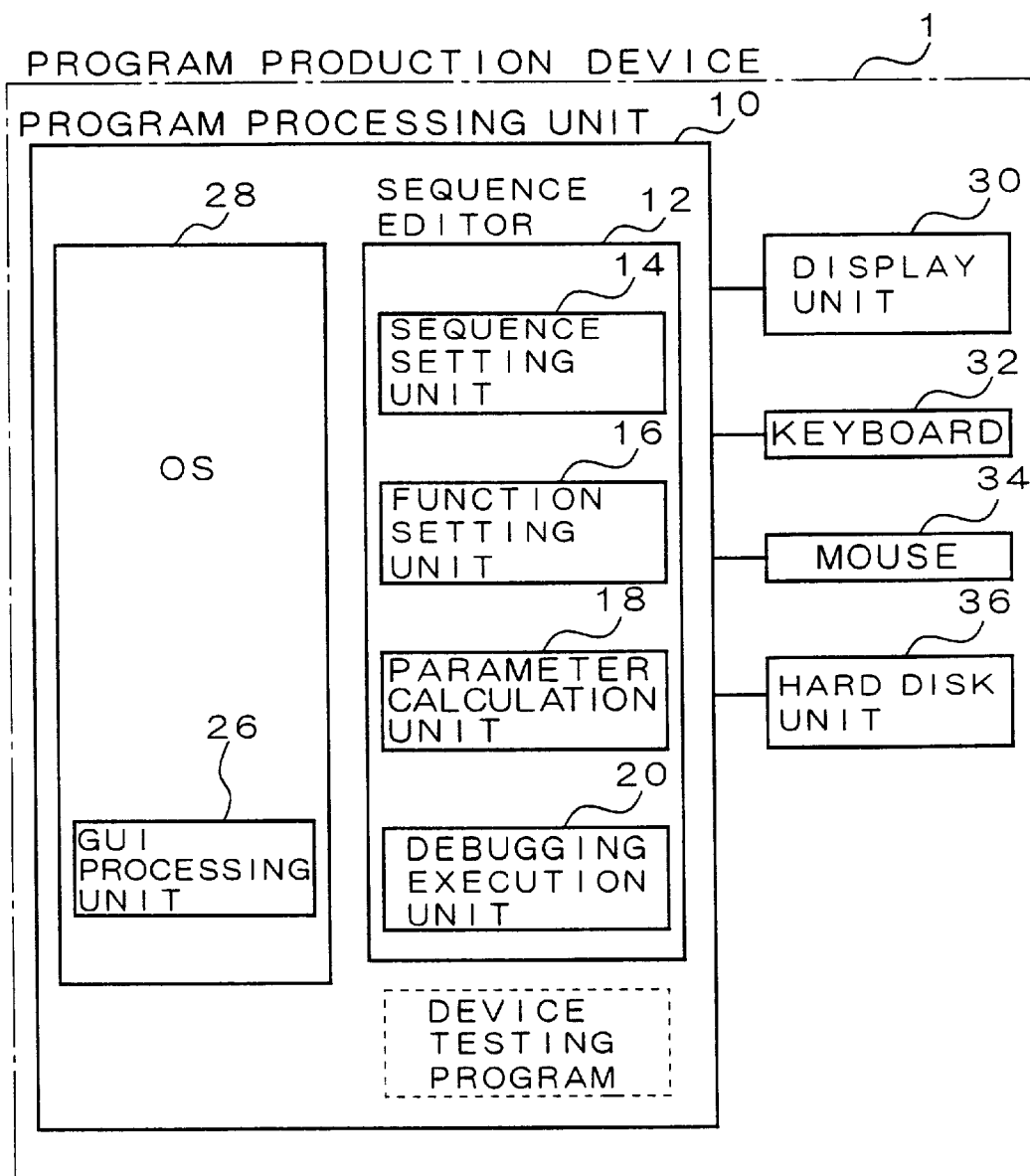
FIG. 3 is a diagram showing a configuration of a program production device that supports the production of device testing programs.

Next, the method of producing device testing programs used on the semiconductor tester 100 mentioned above will be described. FIG. 3 is a diagram showing a configuration of a program production device 1 that supports production of device testing programs. Since in normal practice production of device testing programs is performed using a workstation that is connected to the semiconductor tester 100 and on which the user inputs various operating instructions and on which test results are displayed, the program production device shown in FIG. 3 is realized by using such a workstation.

As shown in FIG. 3, the program production device 1 of this embodiment is configured by including a program processing unit 10 which is realized by executing various programs stored in memory by a processor, a display unit 30 which realizes a man-machine interface with users who produce device testing programs, a keyboard 32, a mouse 34, and a hard disk unit 36 that stores the produced programs.

The program production device 10 mentioned above possesses a sequence editor 12 that operates on a general-use operating system (OS) 28. This sequence editor 12 includes a debugging execution unit 20, which is needed to perform debugging work on device testing programs, in addition to a sequence setting unit 14 needed for production and editing of device testing programs, a function setting unit 16, and a parameter calculation unit 18. The general-use OS mentioned above also includes a GUI (graphical user interface) processing unit 26. The input and output of various kinds of data to and from the user are performed by the GUI in operations by the sequence setting unit 14, the function setting unit 16, and the debugging execution unit 20, but not in operations by the parameter calculation unit 18. If the OS does not support GUI functions, GUI functions may be supported by an application program that runs on the OS. The user, by using the GUI functions, performs necessary input operations by directly entering various types of setting data using the keyboard 32 or by clicking prescribed locations on screen using the mouse 34, while viewing the prescribed operating screens displayed on the display unit 30.

The following will describe a specific procedure in the case where a user performs the production and debugging of a device testing program using the program production device 1. A button for starting the sequence editor 12 is displayed on the screen of the display unit 30. The user performs startup of the sequence editor by clicking this button using the mouse 34. The OS 28 monitors the operating state on the screen by the GUI processing unit 26, and starts up the sequence editor 12 when the startup button is clicked. The program production device 1 then enters the state where it is possible to execute production and editing work on device testing programs and debugging work using the sequence editor 12.

Figure 4:
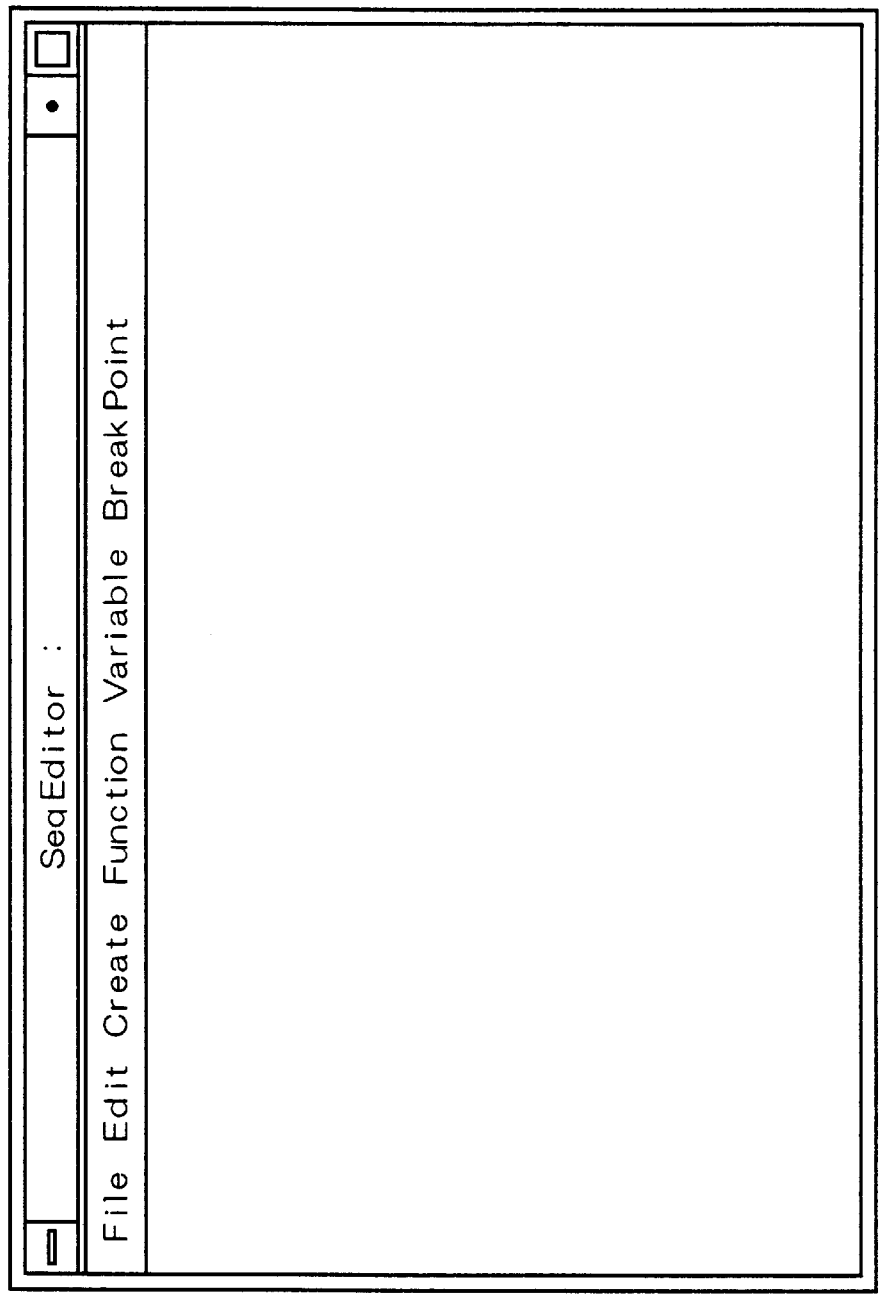
FIG. 4 is a diagram showing a display example of an initial screen of a main window.

First, the sequence editor 12 displays the initial screen for the main window immediately after startup. FIG. 4 is a diagram showing a display example of an initial screen of a main window. Various items of "File," "Editor," "Create," "Function," "Variable," and "BreakPoint" are included in the menu bar of the initial screen of the main window. If any of the items is clicked by the user, a pull-down window corresponding to that item is displayed. The following will be a simple description of the contents of pull-down windows for representative items.

Figure 5:
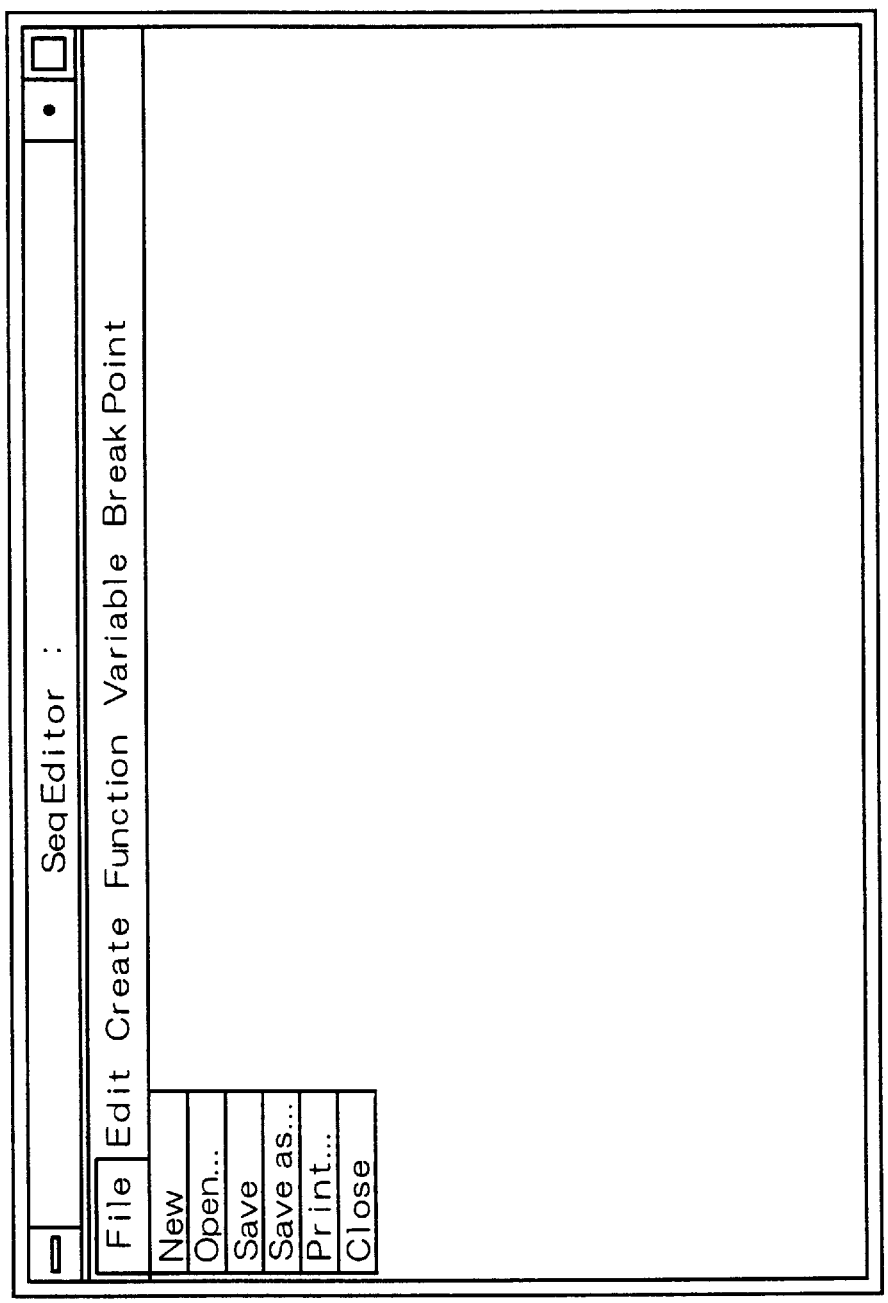
FIG. 5 is a diagram showing a pull-down menu corresponding to "File"

FIG. 5 is a diagram showing a pull-down menu corresponding to "File." "File" is for giving instructions such as to store, read, and print programs. For example, this pull-down menu may include "New," "Open," "Save," "Print," and "Close." "New" is selected in the case of newly producing a device testing program (referred to simply as a "program" hereafter). "Save" is selected in the case of saving a produced program. "Open" is selected in the case of the reading, correcting, or the like of a stored program.

Figure 6:
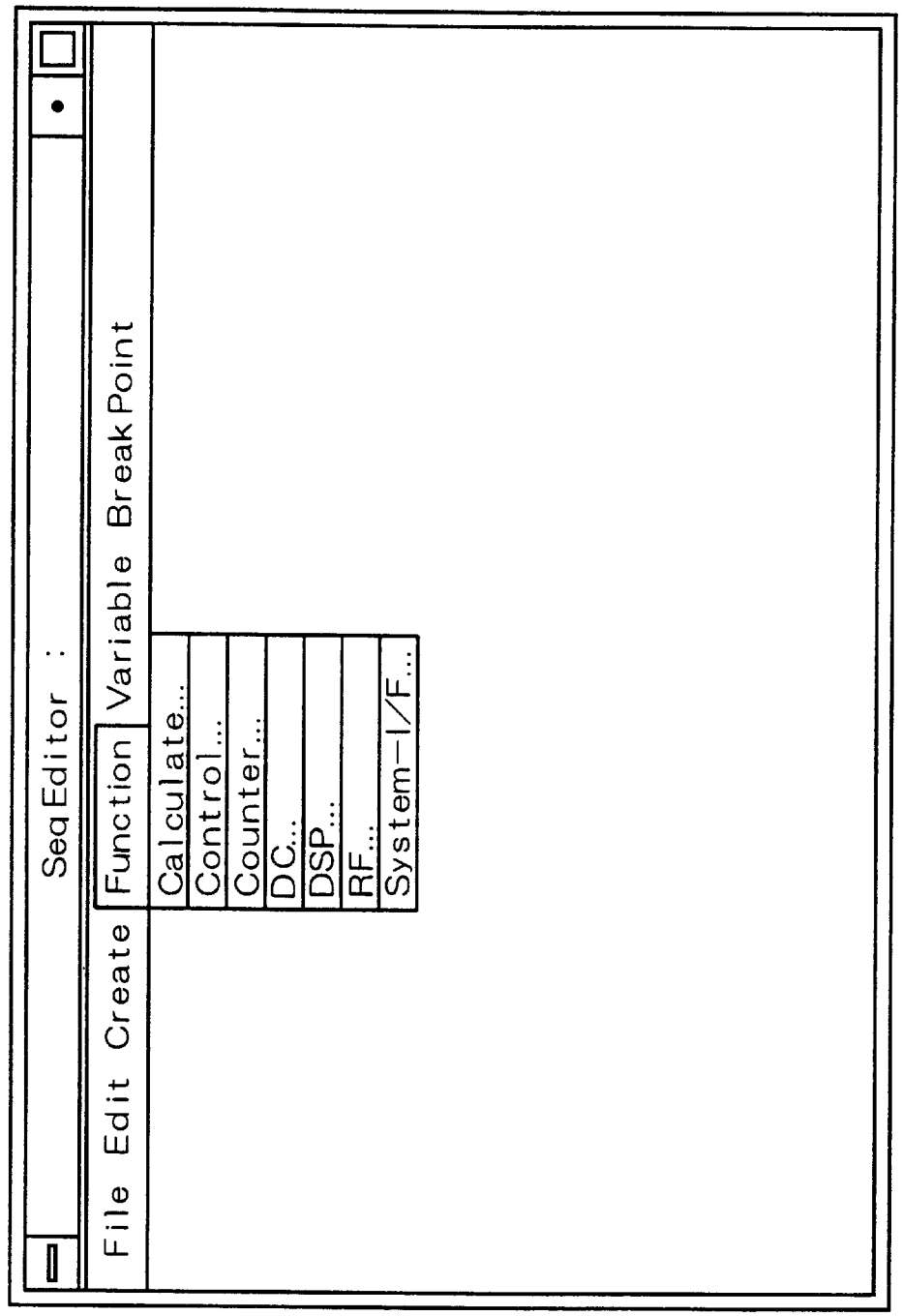
FIG. 6 is a diagram showing a pull-down menu corresponding to "Function"

FIG. 6 is a diagram showing a pull-down menu corresponding to "Function." "Function" is for specifying functions that are the detailed contents of commands during the production of a program. "Calculate," "Control," "Counter," "DC," "DSP," "RF," "System-I/F" and the like are included. Each of these items has many settable functions divided into groups. If any of the items is selected from the pull-down menu, a function setting screen is then displayed that contains a plurality of functions that correspond to the item, so that a desired function may be selected from among them. For example, "Calculate" contains various functions for processing the calculation of numerical values. "Control" contains various functions for control of programs ("if" and "for" or the like). "Counter" contains various functions for control of counter types. "DC," "DSP," and "FR" contain various functions for control of a DC unit, DSP unit, and RF unit (not shown in the figure) provided in the test execution unit 136 of the semiconductor tester 100.

In this way, by displaying settable functions, that is, commands, already divided into groups, the user can select the ones he or she desires to use from among them. Thus, a program can be easily produced even by a user not experienced in program production without the labor of searching at that time, by referring to manuals, for functions that perform the desired operations. Specific examples of screens displayed after selection of items from pull-down menus are described below.

Figure 7:
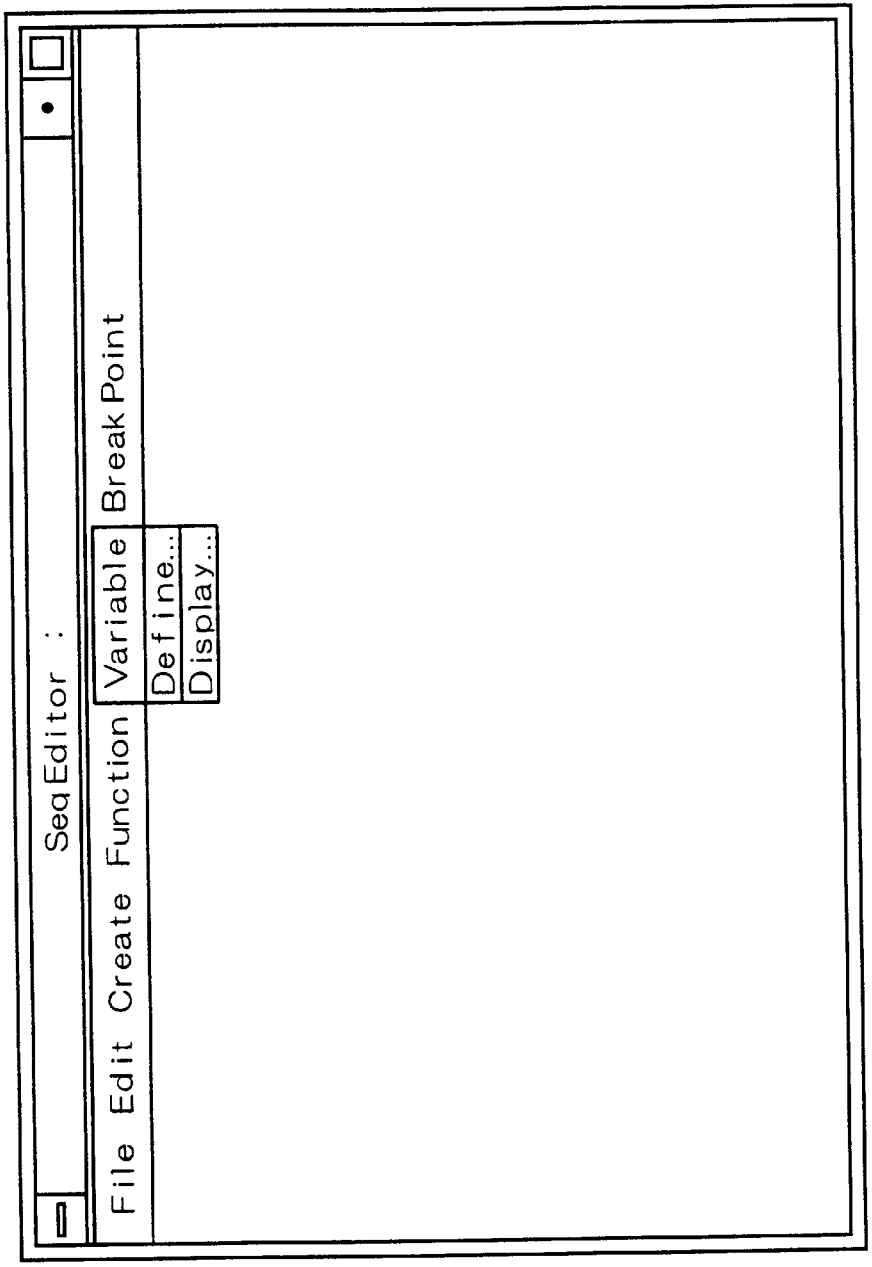
FIG. 7 is a diagram showing a pull-down menu corresponding to "Variable"
Figure 8:
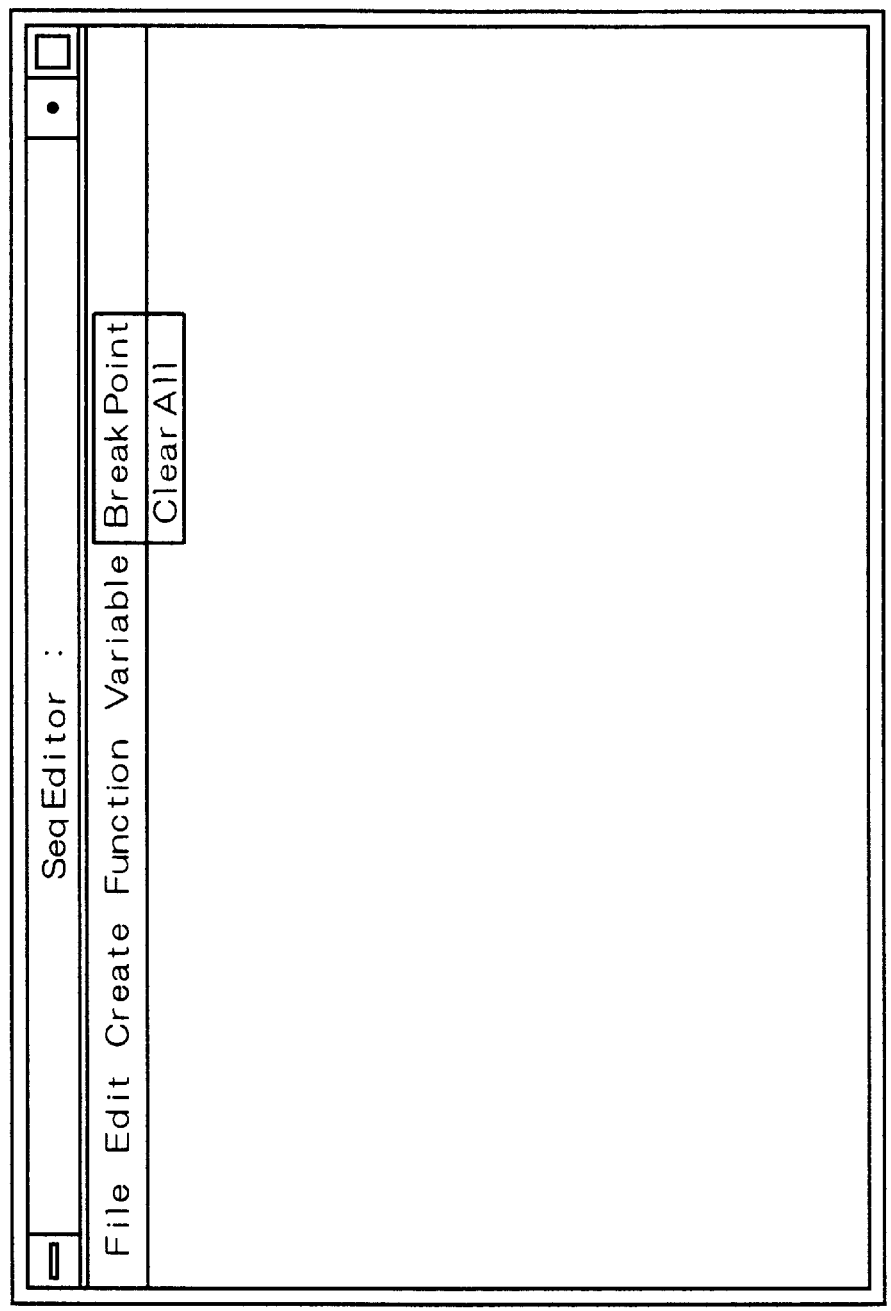
FIG. 8 is a diagram showing a pull-down menu corresponding to "BreakPoint"

FIG. 7 is a diagram showing a pull-down menu corresponding to "Variable." It may, for example, include "Define" for defining variables used in programs and "Display" for displaying the contents of variables. FIG. 8 is a diagram showing a pull-down menu corresponding to "BreakPoint." It may, for example, include "Clear All" for clearing all settings of breakpoints used for debugging. The setting of breakpoints will be described later.

[Program Production Operations]

Next, the following will be a description of the operating procedure for producing a new program, starting from the initial screen of the main window immediately following startup.

In case of producing an entirely new program, for example, the user clicks "File" in the menu bar of the main window shown in FIG. 4 and then, after the pull-down window shown in FIG. 5 is displayed, clicks "New," which is included in the pull-down menu.

Figure 9:
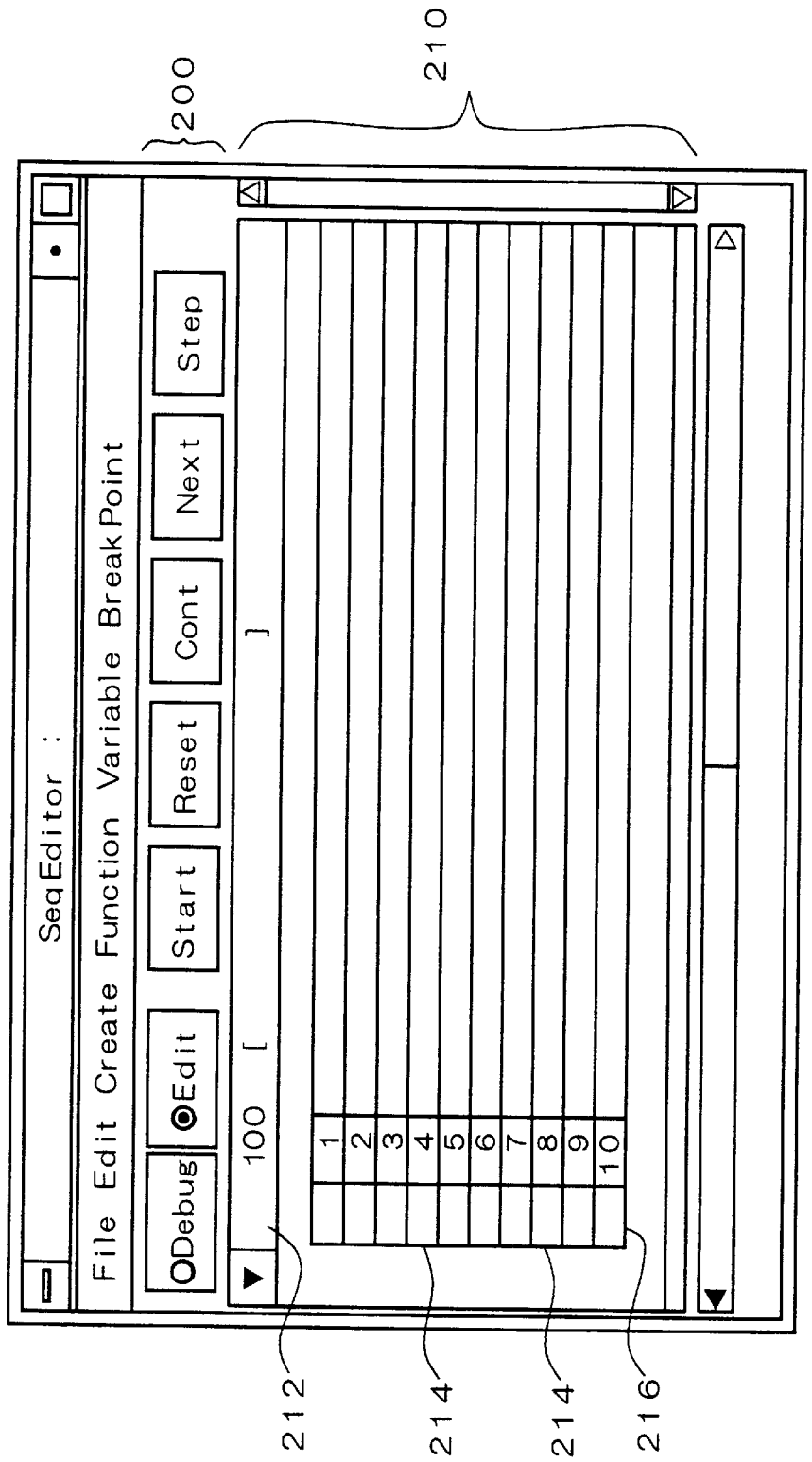
FIG. 9 is a diagram showing a display example of a main window in the case of selecting "New" from a pull-down menu for "File"

FIG. 9 is a diagram showing a display example of a main window in the case where "New" has been selected from the pull-down menu for "File." As shown in FIG. 9, if "New" is selected from the pull-down menu, an execution control button display section 200 and a program display section 210 are newly displayed in the main window. The main window that contains the program display section 210 corresponds to a sequence setting screen.

The execution control button display section 200 contains buttons for "Debug," "Edit," "Start," "Reset," "Cont," "Next," and "Step." In editing work for newly producing a program or for adding corrections after reading out a registered program that has already been produced, the "Edit" button is selected and work is then begun on setting the execution sequence for the program by using the sequence setting unit 14. The buttons other than "Edit" are mainly for debugging. The detailed operations performed when each of these is selected will be described later. Buttons that cannot be selected at this time will be in a non-displayed state. For example, in case of selecting the "Edit" button, only the "Debug" and "Start" buttons will be effective, and the other buttons will be in a non-displayed state in which they cannot be selected.

The program display section 210 includes a test cell 212 and program cells 214. The test cell 212 contains a test number and the basic contents of the test. One assembled program corresponds to one test cell 212. The program cells 214 include a break column 216 on the left edge followed by sequence numbers and program statements corresponding to the sequence numbers. The break column is for setting break points during debugging. In the case of newly creating a program, the screen will be in a state in which a program display section 210 is displayed that contains a plurality of program cells in which consecutive sequence numbers only have been set, as shown in FIG. 9.

When a program from this state is produced, the user clicks a program cell in which he or she wants to enter a statement using the mouse 34. After only one of the program cells has entered the state in which it can be edited, the user clicks "Function," which is contained in the menu bar, to display the pull-down menu shown in FIG. 6 and then from that selects a function group to perform desired settings.

Figure 10:
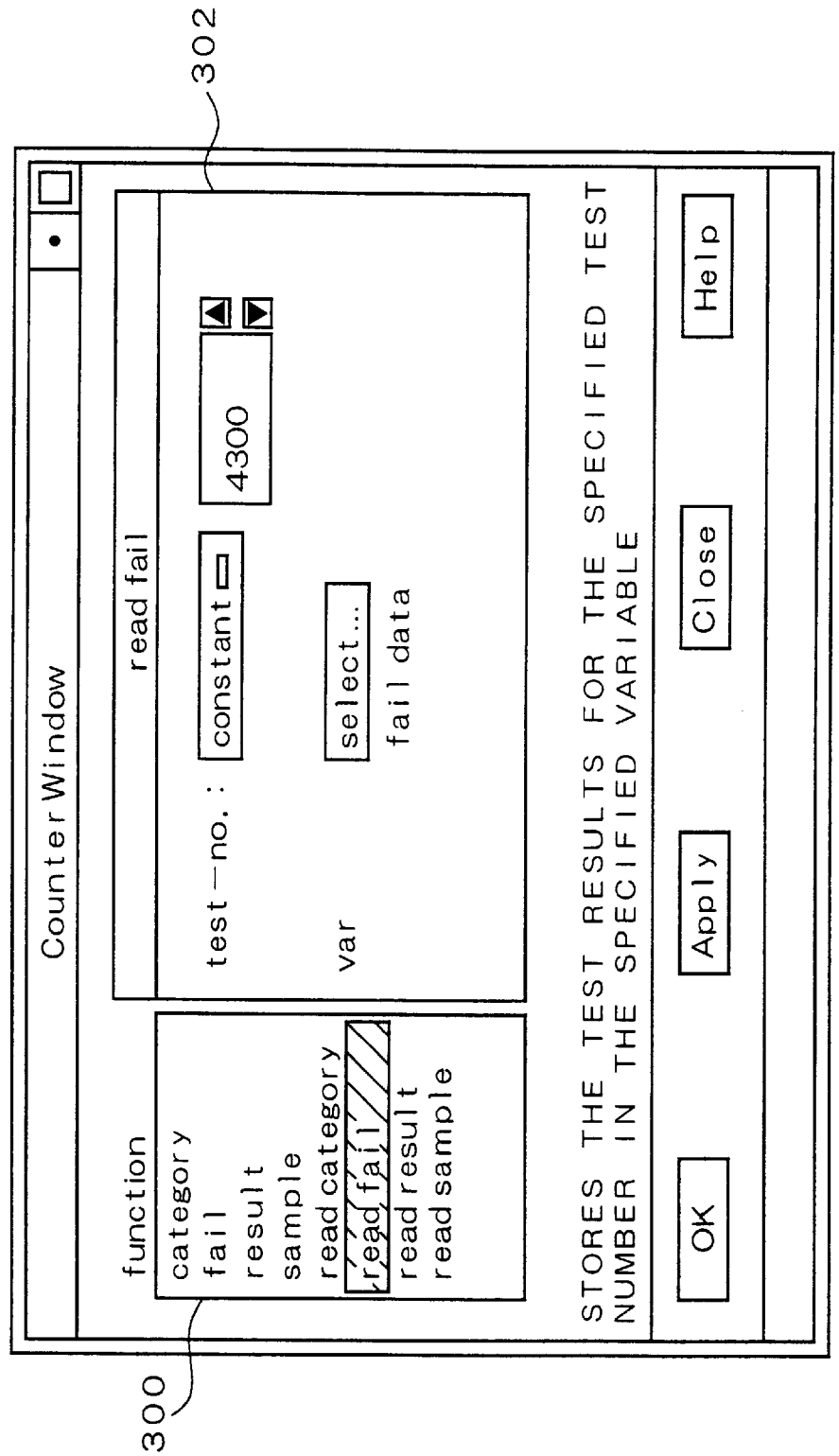
FIG. 10 is a diagram showing a display example in case of selecting "Counter" from a pull-down menu corresponding to "Function"

FIG. 10 is a diagram of a display example in the case where "Counter" has been selected from a pull-down menu for "Function" shown in FIG. 6. When one of the function groups is selected from the "Function" pull-down menu, the function setting unit 16 displays on the display unit 30 a window (in the example shown in FIG. 10, a "Counter Window") corresponding to the selected function group as a function setting screen.

In the counter window shown in FIG. 10, the plurality of functions contained in the function group "Counter" are displayed as a list in a function selection region 300 on the upper left. If the user clicks on any one of these, the function setting unit 16 displays a simple explanation of the function that was clicked below the function selection region 300, and also displays a parameter setting region 302 for setting specific values of the parameters corresponding to the clicked function next to the function selection region 300 on the right.

For example, if "read fail" is clicked as a function, the function setting unit 16 displays the contents of that function as, "Stores the test results for the specified test number in the specified variable." It also displays a parameter setting region 302 that can perform the setting of a test number (test-no.) and the setting of a variable (var), which are the parameters corresponding to this function.

In the example shown in FIG. 10, the fixed value "4300" is set as the test number, and "fail data" is set as the variable that holds the test results. Since when using variables it is necessary to specify the size and type of the variables, it is preferable that an exclusive variable setting screen be displayed and that selection should be made from among variables for which the size and type have already been defined. If the setting of variables is performed in this way, it is possible to prevent ahead of time the generation of errors that arise when using variables for which the size and type have not yet been defined.

FIG. 11 is a display example of a variable definition window (Define Variable Window) for performing definition of variables. It is a specific example of a window that is displayed when the "select" button is clicked in the parameter setting region 302 in the counter window shown in FIG. 10. The types of settable variables are user (user variable), GLOBAL (real number system variables), and FK (logical system variables). When the button corresponding to the type of variable that the user wants to define is clicked, the contents of the variable that is being defined at that time are displayed in a variable table. For example, "fail data" has already been defined as having the contents of "a size of 1, a type of integer (int), and comments of 'fail data area'." To use the variable "fail data" with these contents, specification of the variable in the parameter setting region 302 shown in FIG. 10 is performed by clicking the "OK" button on the lower left of the variable setting screen shown in FIG. 11.

When it is desired to change the contents of a variable that has already been defined, the user clicks the variable whose contents are to be changed from among the choices in the variable table. This displays the defined contents of that variable in a definition contents input region 400. After changing the variable contents as needed, the user makes the change in contents which become effective by clicking the "change" button, and then clicks the "OK" button.

When the user wants to define and use a new variable, after inputting the name, size, comments, and type of the variable to be defined in the variable contents input region 400, the user clicks the "add" button and then clicks the "OK" button after the variable has been added to the variable table.

When the "OK" button on the lower left of the screen is clicked after having completed selection of the function used in the counter window shown in FIG. 10 and the setting of the parameters corresponding to that function, the function setting unit 16 sends the contents of the settings to the sequence setting unit 14. The sequence setting unit 14 sets the contents of the settings that have been received as a statement in the program cell 214 that was selected as the target of the settings at the time that FIG. 9 was displayed.

In this way, the functions contained in the statements and their parameters are set in each of the program cells 214 for the sequence numbers. FIG. 12 is a diagram showing an example of a program that has been created by performing the input of statements corresponding to sequence numbers in this way. For example, sequence number 21 contains a statement using the function "read fail," which has been set using the counter window shown in FIG. 10. The statements corresponding to the other sequence numbers are of the same type. They are set by performing the selection of a function and the setting of the parameters corresponding to the selected function.

However, while in the main window a program of this embodiment has the display format shown in FIG. 12 in order to make editing easier for the user, in the program production processing unit 10 it is handled as an object indicated in FIG. 2. That is, at the time the functions and their parameters are set for the statement numbers, the sequence setting unit 14 sets a array of commands that will be in an ordering corresponding to the sequence numbers, and the function setting unit 16 converts this into OP codes with a one-to-one correspondence to the functions. The parameter calculation unit 18 calculates specific values for the time of execution corresponding to the functions and parameters that have been set by the function setting unit 16. In this way, an array of commands, the OP codes that are their orderings and contents, and the specific values of the parameters are set and a device testing program is produced as an object indicated in FIG. 2.

In the case where the parameter values of functions are set as fixed values, their specific values are set right away through calculation by the parameter calculation unit 18. However, when the parameter values are specified by variables, their specific values cannot be determined except at the time of program execution. Thus, for such parameters, the specific values are calculated by the parameter calculation unit 18 at the time that the program execution instruction is given.

A program produced by the procedure described above may be saved by specifying "Save," which is contained in the pull-down menu corresponding to "File" in the menu bar of the main window. When a save instruction is given by the user, the sequence editor 12 saves the device testing program in the format shown in FIG. 2 on the hard disk unit 36.

In this way, according to this embodiment, various setting screens are displayed on the display unit 30 using the GUI functions possessed by the OS 28. The user can set the types of functions and the corresponding parameters and set the sequence numbers that determine the order of execution of the functions according to the contents of those displays, and can easily produce a device testing program in an interactive style while viewing the display screens. This can significantly reduce the labor required for program production. Furthermore, since the device testing programs are produced as object programs in the format shown in FIG. 2, rather than as source programs, there is no need to have a process that produces an object program using a compiler each time a program is edited, which further reduces the labor required for program production. Moreover, since device testing programs are produced as object only, and no source programs exist, there is an advantage in that program management is simplified.

[Program Debugging Operation]

Next, a description will be given of the operating procedure for debugging a program in the state that was displayed in the main window as stated previously.

In a program of this embodiment, the operation of setting breakpoints may be performed during program production or editing work simply by clicking the break column 216 on the left edge of a program cell 214. This will display a prescribed mark indicating that it is a break point (the in the example shown in FIG. 12). This operation may be performed at the time of program production, and may also be performed after reading in and displaying a program that has been saved following completion of editing work. When the user desires to clear the break points that have been set, he or she may click "Clear All," which is contained in the pull-down menu for "BreakPoint" in the menu bar, as described above.

After break points have been set in this way, the user gives an instruction to begin debugging by clicking the "Debug" button or the "Start" button contained in the execution control button display section 200 of the main window.

The "Debug" button is for giving an instruction to start debugging. When this button is clicked, the debug execution unit 20 executes the program corresponding to the test number displayed at that time in the order starting from the smallest sequence number, and, if a break point has been set, interrupts execution when it reaches that sequence number.

The "Start" button is for giving an instruction to begin debugging operations following the saving of a program currently being edited. The operations after execution of the program on a target are the same as in case of clicking the "Debug" button as described above.

In the debug mode, the "Reset," "Cont," "Next," and "Step" buttons will be in the displayed state, in addition to the "Debug" and "Start" buttons described above, so that the functions corresponding to those buttons may be used.

The "Reset" button is used to halt the operation of the program while it is being executed. The "Cont" (continue) button is used to restart operations that were interrupted at the sequence number where a break point was set. The "Next" button is used to move the program execution position one step forward. When there is a branch command (gosub) to a subroutine in the program, the branch command as a whole, including the processes in the subroutine, is handled as one step. In contrast, the "Step" button is also used to move the program execution position one step forward, but when there is a branch command to a subroutine, the commands in the subroutine are also handled as one step, so that it is possible to interrupt the execution operation within the subroutine.

During the debugging work described above, to find out the current values of variables at a point when program execution has been interrupted at a position set by a break point, the user may click "Display" from the pull-down menu corresponding to "Variable" on the menu bar.

Figure 13:
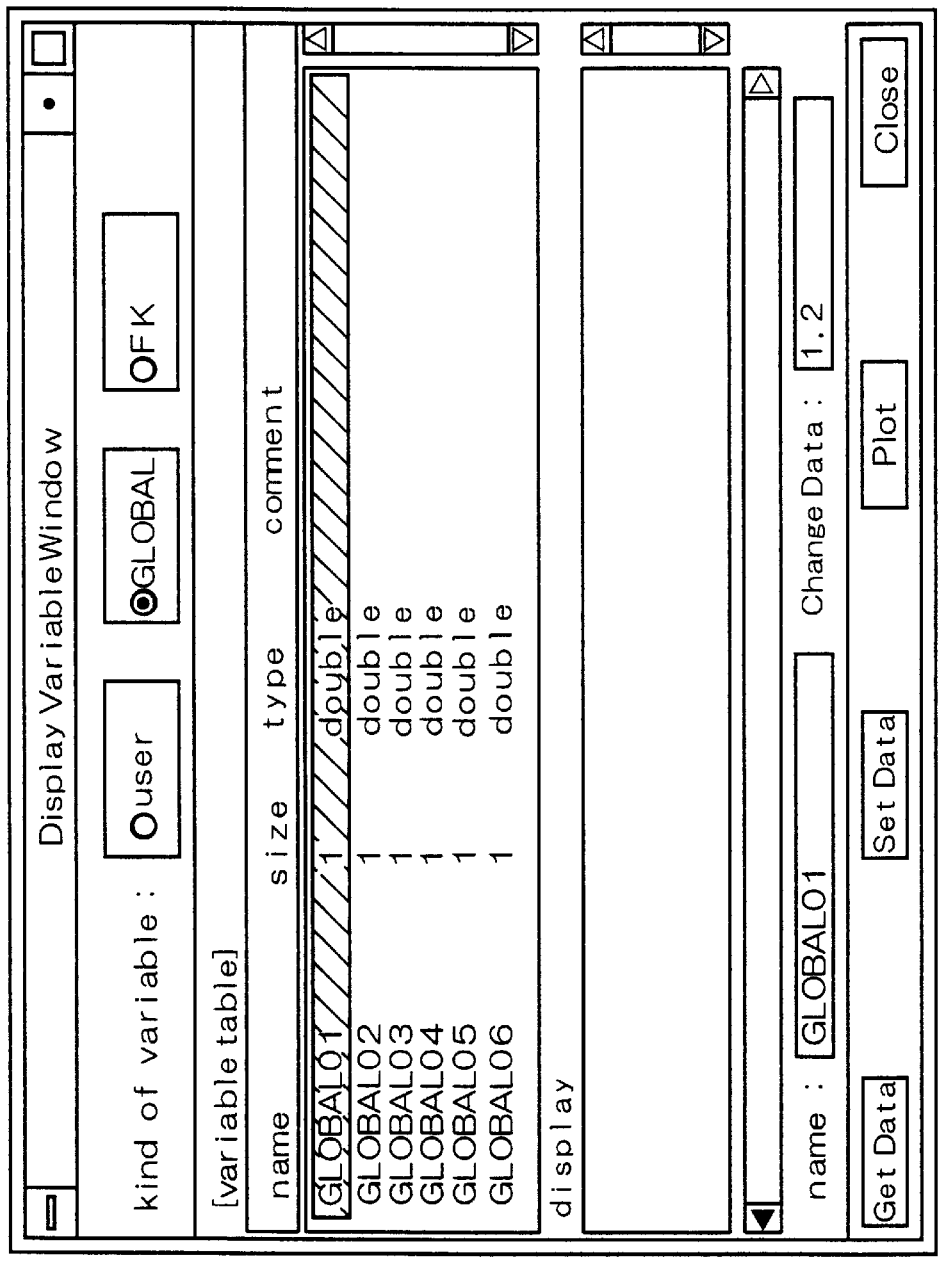
FIG. 13 is a diagram showing a display example of a variable display window in case of selecting "Display" from a pull-down menu corresponding to "Variable."

FIG. 13 is a diagram showing a display example of a variable display window (Display Variable Window) when "Display" has been selected from the pull-down menu corresponding to "Variable." The variables in use are displayed in the variable table region when the user selects a variable type from among "user," "GLOBAL," and "FK." After a variable for which the user wishes to find out the value has been clicked, when the user clicks the "Get Data" button displayed on the lower left of the window, the value of that variable will be displayed in the display region positioned below the variable table. When the user wishes to continue the debugging operation after checking the values of variables in this way, he or she clicks the "Close" button displayed on the lower right of the window and then, after this window closes, clicks the "Cont" button contained in the execution control button display section 200 of the main window.

To continue the debugging operation after changing a variable value that has been checked, the user clicks the "Set Data" button after directly inputting the changed value in the "change data" input field, to set the value following the change into the variable on a target. Thereafter, in the same manner as when not changing variable values, the user clicks the "Close" button displayed on the lower right of the window and then, after the window closes, clicks "Cont" button, which is contained in the execution control button display section 200 of the main window.

In this way, according to this embodiment, since a device testing program is produced as an object, break points can be set during producing the program or during editing work, and debugging instructions can be given directly to the edited program when executing debugging operations. Thus the work-hours required for debugging operations are significantly reduced in comparison to the case in which debugging operations are performed in the conventional manner by executing an object program while editing a source program.

The present invention is not limited to the embodiment described above, but may have various embodiments within the range of the gist of the present invention. For example, the program production device 1 of this embodiment is realized using a workstation connected to a semiconductor tester 100, but program production may also be performed using a personal computer or the like with which GUI processing is possible.

What is claimed is:

1. A program production system for generating a test program for a semiconductor tester comprising:
    a sequence setting unit which displays a sequence setting screen possessing a plurality of program cells corresponding to an execution sequence of a program and which, when specifying any of said program cells, sets an execution sequence for commands on a target in correspondence with the positions of the specified program cells; and
    a function setting unit which displays function setting screens which, when a plurality of previously prepared functions for semiconductor testing and parameters corresponding to said functions exist, includes those parameters, and which, when specifying any of said functions, sets said specified functions so as to correspond to said commands on a target and sets the values of said corresponding parameters, and further comprising a parameter calculation unit for converting the values of parameters of said functions set by said function setting unit into an execution format;

for making groupings of prescribed codes corresponding to the types of said functions set by said function setting unit and the values of said parameters corresponding to said functions following conversion into an execution format by said parameter calculation unit; and for producing a program as an object by arranging said groupings into an execution sequence set by said sequence setting unit in absence of performing a compiling operation.

2. The program production system for a semiconductor tester according to claim 1, wherein said functions corresponding to said commands and said parameters corresponding to said functions respectively correspond to functions of the C language and their corresponding parameters.

3. The program production system for a semiconductor tester according to claim 1, further comprising debugging execution unit for performing debugging operations by executing said program that is a target of production.

4. The program production system for a semiconductor tester according to claim 3, wherein break points for interrupting processing during debugging operations are set in a part of said program cells.

5. A program production system for a semiconductor tester according to claim 3, wherein setting of said break points is performed during said program production or during editing.

* * * * *